United States Patent
Basker et al.

(10) Patent No.: US 9,911,849 B2
(45) Date of Patent: Mar. 6, 2018

(54) TRANSISTOR AND METHOD OF FORMING SAME

(71) Applicant: International Business Machines Corporation, Armonk, NY (US)

(72) Inventors: Veeraraghavan S. Basker, Schenectady, NY (US); Nicolas L. Breil, Mountain View, CA (US); Oleg Gluschenkov, Poughkeepsie, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/957,866

(22) Filed: Dec. 3, 2015

(65) Prior Publication Data
US 2017/0162694 A1    Jun. 8, 2017

(51) Int. Cl.
| | | |
|---|---|---|
| *H01L 21/336* | (2006.01) | |
| *H01L 21/8234* | (2006.01) | |
| *H01L 29/78* | (2006.01) | |
| *H01L 21/8238* | (2006.01) | |
| *H01L 27/092* | (2006.01) | |
| *H01L 29/201* | (2006.01) | |

(Continued)

(52) U.S. Cl.
CPC .. *H01L 29/7848* (2013.01); *H01L 21/823807* (2013.01); *H01L 21/823814* (2013.01); *H01L 21/823821* (2013.01); *H01L 27/0924* (2013.01); *H01L 29/201* (2013.01); *H01L 29/205* (2013.01); *H01L 29/207* (2013.01)

(58) Field of Classification Search
CPC ............... H01L 29/7848; H01L 29/66636
USPC .............................................. 438/555
See application file for complete search history.

(56) References Cited

U.S. PATENT DOCUMENTS 5,960,299 A * 9/1999 Yew ................. H01L 21/76229
148/DIG. 50
6,274,894 B1 * 8/2001 Wieczorek .......... H01L 29/0847
257/192

(Continued)

FOREIGN PATENT DOCUMENTS

CN    104064467 A    9/2014

OTHER PUBLICATIONS

"The General Properties of Si, Ge, SiGe, SiO2 and Si3N4", Virginia Semiconductor, Jun. 2002.*

*Primary Examiner* — Meiya Li
*Assistant Examiner* — Peter M Albrecht
(74) *Attorney, Agent, or Firm* — Steven J. Meyers; Hoffman Warnick LLC

(57) ABSTRACT

A first aspect of the invention provides for a transistor. The transistor may include a gate stack on a substrate; a channel under the gate stack within the substrate; a doped source and a doped drain on opposing sides of the channel, the doped source and the doped drain each including a dopant, wherein the dopant and the channel together have a first coefficient of diffusion and the doped source and the doped drain each have a second coefficient of diffusion; and a doped extension layer substantially separating each of the doped source and the doped drain from the channel, the doped extension layer having a third coefficient of diffusion, wherein the third coefficient of diffusion is greater than the first coefficient of diffusion.

11 Claims, 9 Drawing Sheets

(51) Int. Cl.
*H01L 29/205* (2006.01)
*H01L 29/207* (2006.01)

(56) References Cited

U.S. PATENT DOCUMENTS

| | | | |
|---|---|---|---|
| 6,365,476 B1* | 4/2002 | Talwar | H01L 29/6659 257/E21.134 |
| 6,621,131 B2* | 9/2003 | Murthy | H01L 29/1054 257/192 |
| 6,989,322 B2* | 1/2006 | Gluschenkov | H01L 29/0847 257/E21.165 |
| 7,132,337 B2 | 11/2006 | Jakschik et al. | |
| 7,790,516 B2 | 9/2010 | Willer et al. | |
| 7,879,675 B2 | 2/2011 | Radosavljevic et al. | |
| 8,889,494 B2 | 11/2014 | Toh et al. | |
| 8,900,978 B1* | 12/2014 | Loubet | H01L 29/7848 257/E21.102 |
| 8,937,299 B2 | 1/2015 | Basu et al. | |
| 9,202,920 B1* | 12/2015 | Liu | H01L 29/785 |
| 9,343,300 B1* | 5/2016 | Jacob | H01L 29/66553 |
| 9,379,208 B2* | 6/2016 | Tsai | H01L 21/26506 |
| 2006/0189053 A1* | 8/2006 | Wang | H01L 29/165 438/197 |
| 2006/0246673 A1* | 11/2006 | El-Farhane | H01L 29/6653 438/303 |
| 2007/0164352 A1 | 7/2007 | Padilla et al. | |
| 2008/0124877 A1* | 5/2008 | Pei | H01L 29/66545 438/300 |
| 2008/0258225 A1 | 10/2008 | Yang et al. | |
| 2008/0265256 A1* | 10/2008 | Lin | H01L 29/665 257/70 |
| 2010/0012988 A1* | 1/2010 | Yang | H01L 21/26506 257/288 |
| 2012/0305893 A1 | 12/2012 | Colinge | |
| 2013/0149830 A1* | 6/2013 | Rhee | H01L 29/66477 438/303 |
| 2013/0248948 A1* | 9/2013 | Ma | H01L 29/66636 257/288 |
| 2014/0217519 A1* | 8/2014 | Qin | H01L 29/66636 257/408 |
| 2015/0021625 A1 | 1/2015 | Utomo et al. | |
| 2015/0048417 A1* | 2/2015 | Kwok | H01L 29/7848 257/190 |
| 2015/0102393 A1* | 4/2015 | Mieno | H01L 29/66795 257/288 |
| 2015/0214345 A1* | 7/2015 | Wan | H01L 29/7848 257/105 |
| 2015/0236157 A1* | 8/2015 | Kwok | H01L 29/7848 257/192 |
| 2015/0243756 A1* | 8/2015 | Obradovic | H01L 29/66795 438/285 |

* cited by examiner

TRANSISTOR AND METHOD OF FORMING SAME

BACKGROUND

Technical Field

The present invention relates to transistors, and more particularly, to transistors including materials having distinct coefficients of diffusion and methods of forming the same.

Related Art

State of the art transistors can be fabricated by forming a gate stack over or around a semiconductor substrate. Generally, transistor fabrication implements lithography and etching processes to define the gate stacks and channels. The channels are defined within a lightly doped portion of the substrate and the gate stacks are formed over the channels. The channel doping is typically selected to be opposite to that of transistor charge carriers. For instance, an n-channel transistor that employs electrons as charge carriers will have a lightly doped p-type channel. The term "p-type" refers to the addition of impurities to an intrinsic semiconductor that creates deficiencies of valence electrons. "N-type" refers to the addition of impurities that contributes free electrons to an intrinsic semiconductor. After providing the gate stacks over the channel, a source and a drain may be formed into a portion of the substrate and on both sides of each gate stack by ion implantation. Sometimes this implant is performed using a spacer to create a specific distance between the channel and the implanted junction. Sources and drains may be doped with a p-type or n-type dopants to form p-channel and n-channel transistors, respectively. After doping, the transistor may typically be subjected to a thermal treatment process in which the transistor is exposed to high temperatures for a specified period of time. Thermal treatment processes can result in diffusion of the dopants from the source and drain to the transistor body, or channel. Diffusion-enabled source and drain extensions overlap with the edges of the gate stack to allow for an unimpeded current flow from the transistor channel to/from source drain regions. Such source and drain extensions regions are simply referred to as the extensions. The diffusion process smears original source and drain dopant profiles resulting in a non-abrupt dopant profile at the interface between the channel and the extensions. Threshold voltages and the rate of transistor switching depend on, inter alia, the composition and the doping profile. Non-abrupt doping profiles retard device performance.

SUMMARY

A first aspect of the invention provides for a transistor. The transistor may comprise: a gate stack on a substrate; a channel under the gate stack within the substrate; a doped source and a doped drain on opposing sides of the channel, the doped source and the doped drain each including a dopant, wherein the dopant and the channel together have a first coefficient of diffusion and the doped source and the doped drain each have a second coefficient of diffusion; and an doped extension layer substantially separating each of the doped source and the doped drain from the channel, the doped extension layer having a third coefficient of diffusion, wherein the third coefficient of diffusion is greater than the first coefficient of diffusion.

A second aspect of the invention provides for a method of forming a transistor. The method may comprise: forming a gate stack on a substrate, the gate stack having a channel thereunder; forming a pair of openings in the substrate, the pair of openings having a first opening on a first side of a gate stack and a second opening on a second side of the gate stack; forming an extension layer to substantially coat each opening, forming a doped source in the first opening and a doped drain in the second opening, thereby forming the transistor, each of the doped source and the doped drain including a dopant; and performing a thermal treatment process to cause diffusion of the dopant, wherein the dopant and the channel together have a first coefficient of diffusion, and the dopant and the extension layer together have a second coefficient of diffusion, and wherein the second coefficient of diffusion is greater than the first coefficient of diffusion.

A third aspect of the invention provides for a method for forming a fin-shaped field effect transistor (FINFET). The method may comprise: forming a gate stack on a substrate, the gate stack having a channel thereunder; forming a pair of openings in the substrate, the pair of openings having a first opening on a first side of a gate stack and a second opening on a second side of the gate stack; etching the sidewalls of each opening such that the gate stack overlaps with each of the openings; forming an extension layer to substantially coat each opening; forming a doped source in the first opening and a doped drain in the second opening, thereby forming the FINFET, each of the doped source and the doped drain including a dopant; and performing a laser anneal at a temperature that melts the extension layer without melting the channel and causes diffusion of the dopant from the doped source and the doped drain into the extension layer, wherein the dopant and the channel together have a first coefficient of diffusion and the dopant and the extension layer together have a second coefficient of diffusion, and wherein the second coefficient of diffusion is greater than the first coefficient of diffusion.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
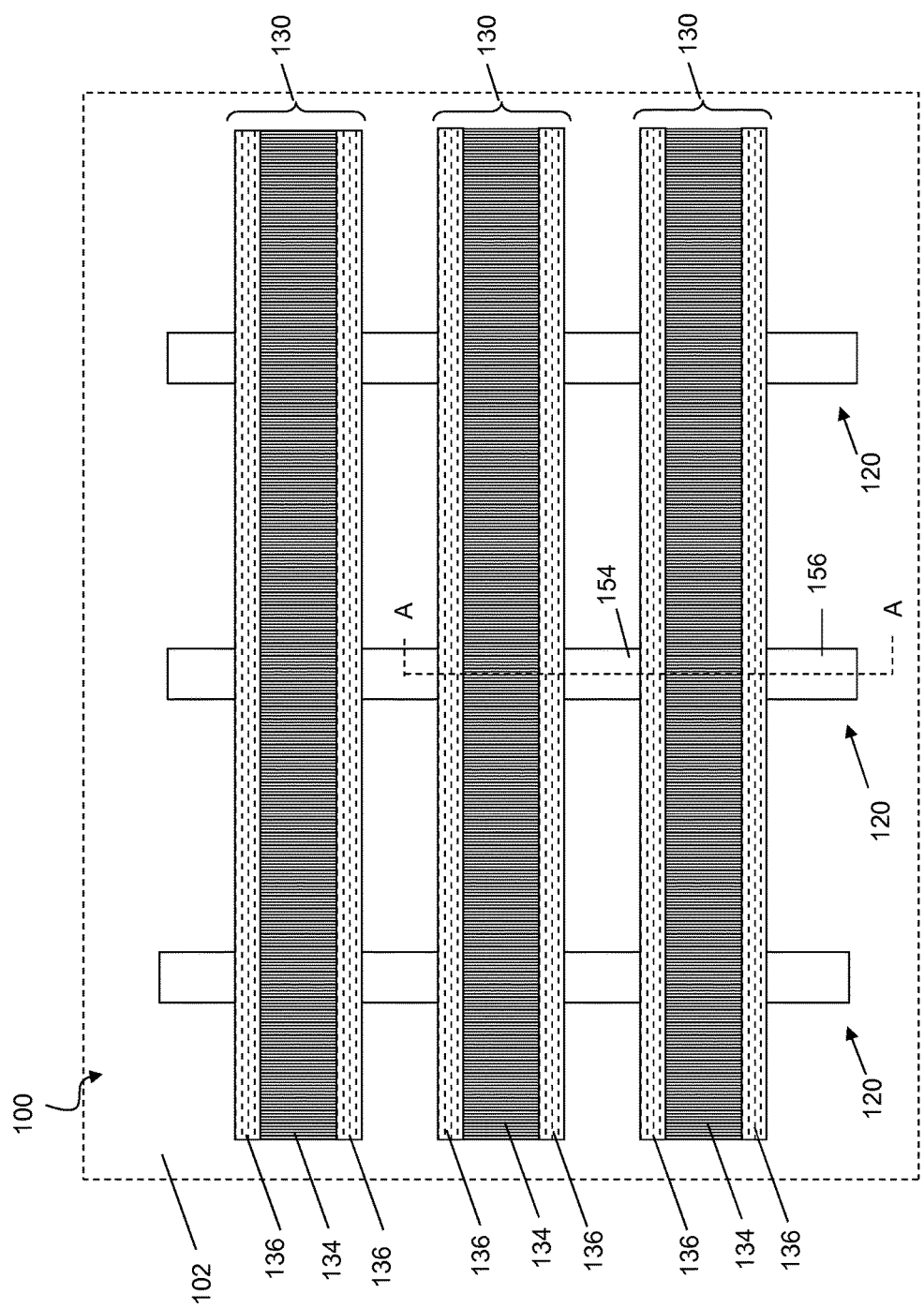
FIG. 1 shows a top view of a transistor.

Aspects of the present invention according to various embodiments provide for transistors, and more specifically, transistors including materials having distinct coefficients of diffusion of dopants and methods of forming the same. Embodiments of the present invention include a transistor having a gate stack on a substrate, a channel under or surrounded by the gate stack within the substrate, a source and a drain on opposing sides of the channel, and an extension layer substantially separating each of the source and the drain from the channel. The extension layer may have a coefficient of diffusion of a source and drain dopant that is greater than the coefficient of diffusion of the channel for the same dopant and melting point that is lower than that of the source, the drain, and the channel. This results in a dopant of the source and drain diffusing into the extension layer but not into the channel. As used herein, "coefficient of diffusion" and/or "diffusion coefficient" refer to a proportionality constant in the Fick's law of diffusion describing the movement of particles in a given time through a given area, also referred to as the flux of particles, caused by a spatial gradient of particle concentration. Each specie in each material may have its own coefficient of diffusion. Diffusion coefficients for a given specie in a particular material may be dependent on the temperature, pressure, electrically active concentration of dopants, and the state of the material, i.e., whether the material is in a liquid or solid state. Additionally, each material and/or species may have its own melting point. As used herein, "melting point" refers to the temperature of which a solid may turn into a liquid.

The present invention according to various embodiments uses the differences of the coefficient of diffusion of dopants and melting points of the materials used for an extension layer, channel, and source and drain to prevent diffusion of the dopants from the source and drain into the channel during thermal treatment processes after sources and drains are created. As will be described herein, various embodiments of the present invention include using materials for the extension layer that have a greater coefficient of diffusion for the selected source and drain dopant, and a lower melting point than the channel. Additionally, various embodiments of the present invention include performing thermal treatment processes at a high temperature performed for a shorter amount of time than that which is conventionally used, and preferably at or above the melting point of the extension layer, but below the melting point of other layers. The combinations of materials and the thermal treatment processes described herein result in redistribution of dopants from the source/drain into the extension layer while little to no dopants diffuse into the channel. That is, embodiments of the present invention provide for an abrupt doping profile at interface of the extension layer and channel.

Figure 2:
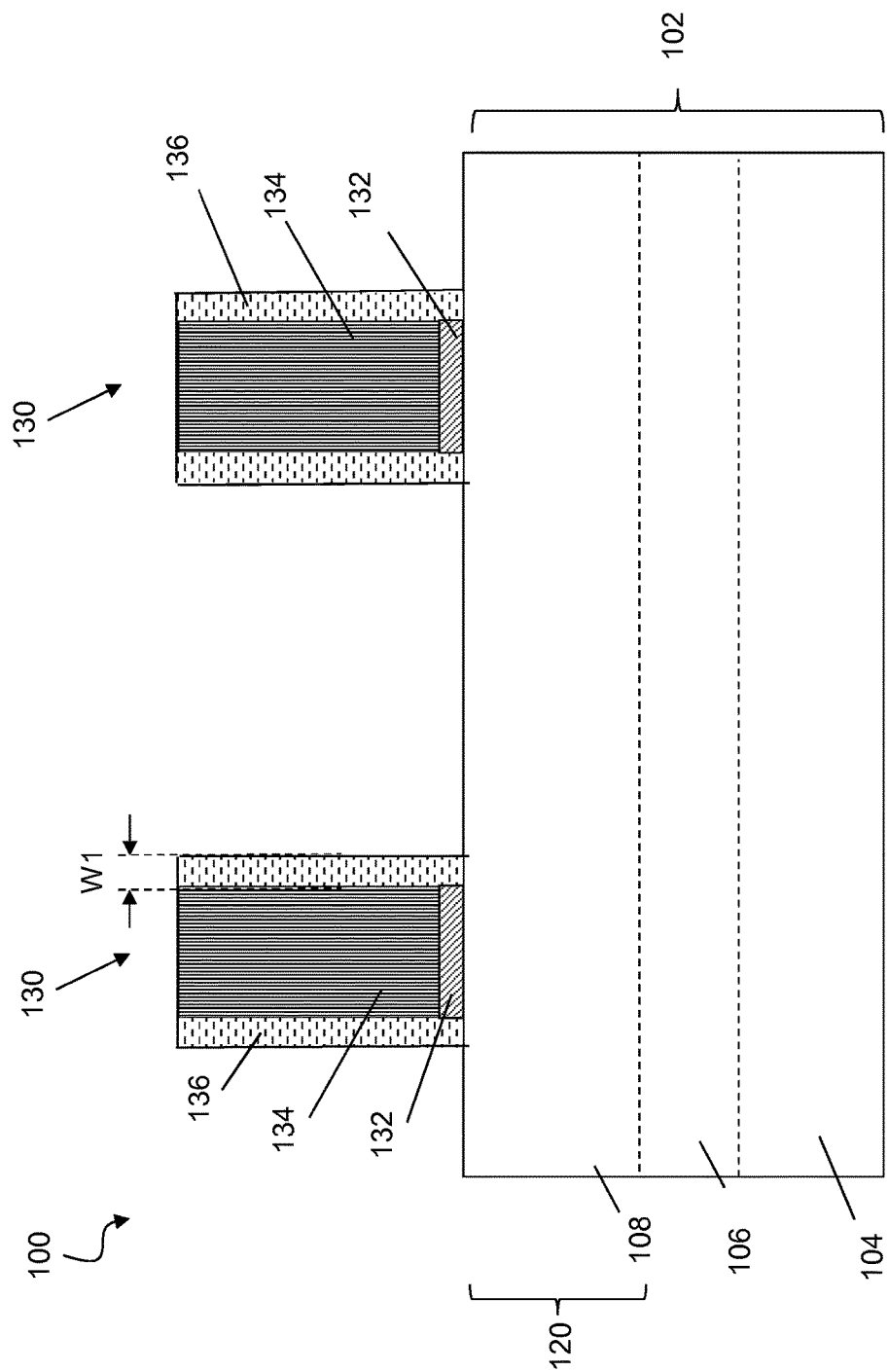
FIG. 2 shows a cross-sectional view of the transistor of FIG. 1 taken along line A-A.

FIG. 1 shows a demonstrative illustration of a top view of a portion of a substrate 102 (e.g., a portion of an integrated circuit) (shown in phantom) including an integrated circuit (IC) structure such as a fin-shaped field-effect transistor (FINFET) 100 which includes a plurality of fins 120 perpendicular to and connected to gate stacks 130. FIG. 2 shows a cross-section of FINFET 100 along line A-A of FIG. 1. Referring to FIGS. 1-2 together, a method for forming the transistor will now be described. While aspects of the present invention are shown and described with respect to a FINFET, it is to be understood that aspects of the present invention may be employed with other transistors such as, but not limited to, field-effect transistors, including transistors with different geometrical orientations and shapes of their channels such as planar FETs, surround-gate FETs, multiple-gate FETs, nano-wire or nano-sheet FETs, and vertical FETs. FINFET 100 may be formed on a substrate 102. It will be understood that when an element as a layer, region or substrate is referred as being "on", "over" or "around" another element, it can be directly on the other element or intervening elements may be present. As will be described herein, FINFET 100 may have a plurality of gate stacks 130 perpendicular to a plurality of fins 120, and each fin may have a source 154 and drain 156.

FINFET 100 may be formed by any method known in the art. For example, FINFET 100 may be formed by forming a substrate 102. Substrate 102 may include a semiconductor layer 104, an isolation layer 106, and another semiconductor layer 108. Semiconductor layers 104, 108 can include any conventional semiconductor substrate material including but are not limited to alloys of carbon, silicon, germanium, tin, silicon germanium, germanium tin, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor layers 104, 108 may be strained. Isolation layer 106 which can be formed by doping a portion of the semiconductor layer 104 or by forming a dielectric layer, e.g., silicon dioxide ($SiO_2$). Isolation layer 106 may be doped with dopants of opposite polarity of the transistor-type and of the same polarity as the transistor channel, e.g., channel 142 (FIG. 6), but at a typically higher doping level than that of the channel. Additional isolation structures (not shown) may be present within semiconductor layer 104 and isolation layer 106 to facilitate isolation between different transistors and between a source and a drain, e.g., source 154 and drain 156, of the same transistor. Semiconductor layer 104 may also contain other useful structures such as capacitors, transistors, and/or buried interconnects (not shown). Thermal stability of useful structures present in semiconductor layer 104 and isolation layer 106 may put a limitation on any thermal treatment of overlaying structures. Overlying isolation layer 106 may be semiconductor layer 108. As will be described herein, semiconductor layer 108 facilitates the formation of fins and channels. Isolation layer 106 and semiconductor layers 104, 108 may be formed according to conventional techniques, e.g., deposition, etc. prior to the processes described according to the various embodiments of the invention. As used herein, and unless otherwise noted, the term "depositing" may include any now known or later developed techniques appropriate for the material to be deposited including but are not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. In one embodiment, isolation layer 106 and semiconductor layer 108 are formed over semiconductor layer 104 using sequential CVD epitaxial growth with in-situ doping. The epitaxial growth may be conducted multiple times to form separate stacks of isolation layer 106 and semiconductor layer 108 for re-channel and p-channel transistors. Multiple epitaxial stacks of isolation layer 106 and semiconductor 108 are formed by disposing hard mask (e.g., a thin layer of $SiO_2$) over selected regions of semiconductor layer 104 and performing selective epitaxial growth that deposits crystalline doped semiconductors only in exposed areas of semiconductor layer 104.

A set of fins 120 may be formed within substrate 102 (and more particularly, over isolation layer 106). Set of fins 120 can be formed from semiconductor layer 108, e.g., via conventional etching and masking techniques known in the art and/or described herein. As used herein, "etching" may include any now known or later developed techniques appropriate for the material to be etched including but not limited to, for example: anisotropic etching, plasma etching, sputter etching, ion beam etching, reactive-ion beam etching and reactive-ion etching (RIE). Overlying each fin 120 may be a hard mask (not shown), which can be formed according to known techniques to shield each fin 120 in the set of fins during subsequent processing steps. It is understood that use of the hard mask over each fin 120 is optional and sacrificial such that it is removed prior to forming gate stack 130 in some embodiments. The later formed gate stack 130 will wrap around each fin 120 to form a gate stack 130, which is known in the art. However, prior to forming gate stack 130 over the exposed fins 120, fins 120 may be lightly doped with dopants opposite of the transistor type which facilitate the formation of channel regions as will be described herein. The doping of fins 120 may be performed during the formation of semiconductor layer 108 as alluded herein.

Still referring to FIGS. 1-2, gate stack 130 may be formed on substrate 102, or more particularly, over set of fins 120. Gate stack 130 can include a gate dielectric 132, and a gate electrode 134 overlying gate dielectric 132. Gate dielectric 132 may include, but is not limited to: metal oxides, metal oxynitrides, metal silicon oxides, metal silicon oxynitrides, metal germanium oxides, metal germanium oxynitrides, and alloys, mixtures or multilayers of the same, where the metal may be selected from aluminum (Al), barium (Ba), beryllium (Be), bismuth (Bi), carbon (C), calcium (Ca), cerium (Ce), cobalt (Co), chromium (Cr), dysprosium (Dy), europium (Eu), iron (Fe), gallium (Ga), gadolinium (Gd), hafnium (Hf), indium (In), lanthanum (La), lithium (Li), magnesium (Mg), manganese (Mn), molybdenum (Mo), niobium (Nb), nickel (Ni), praseodymium (Pr), scandium (Sc), strontium (Sr), tantalum (Ta), titanium (Ti), vanadium (V), tungsten (W), yttrium (Y), zinc (Zn), and zirconium (Zr). Gate electrode 134 may include, but is not limited to: poly-silicon, or a metal such as, tungsten (W), cobalt (Co), aluminum (Al) or combinations thereof or a fully silicided gate (FUSI). Gate stack 130 can be formed by any deposition technique known in the art and/or described herein. It is understood that gate stack 130 can act as an actual (final) gate stack in the gate-first process flow, or alternatively, as a dummy gate stack which is later replaced with an actual gate stack later in time (in a gate-last process flow).

Additionally, a spacer 136 may be formed over sidewalls of gate electrode 134 and gate dielectric 132, leaving sidewalls of each fin 120 exposed. Spacers 136 can be formed by a combination of additive deposition and subtractive etching techniques known in the art. Typically, one of the additive deposition or the subtractive etching is selected to be conformal or isotropic while the other is chosen to be directional resulting in forming spacer material on either vertical or horizontal surfaces. Conformal deposition such as ALD and directional etching such as RIE leads to vertical spacers as shown in FIG. 2, while directional deposition and isotropic etching may lead to horizontal spacers. Spacers 136 may include, but is not limited to: oxides or nitrides such as silicon nitride (SiN) or silicon dioxide ($SiO_2$). Various additive atoms such as carbon, boron, and fluorine may be added to the spacer material to reduce its dielectric permittivity and to control its etch rate. Spacers 136 may have a width W1 of approximately 1 nanometers (nm) to approximately 10 nm. As used herein "approximately" is intended to include values, for example, within 10% of the stated values. Any portion of spacers 136 that is formed over gate electrode 134 may be removed via, for example, etching.

Figure 3:
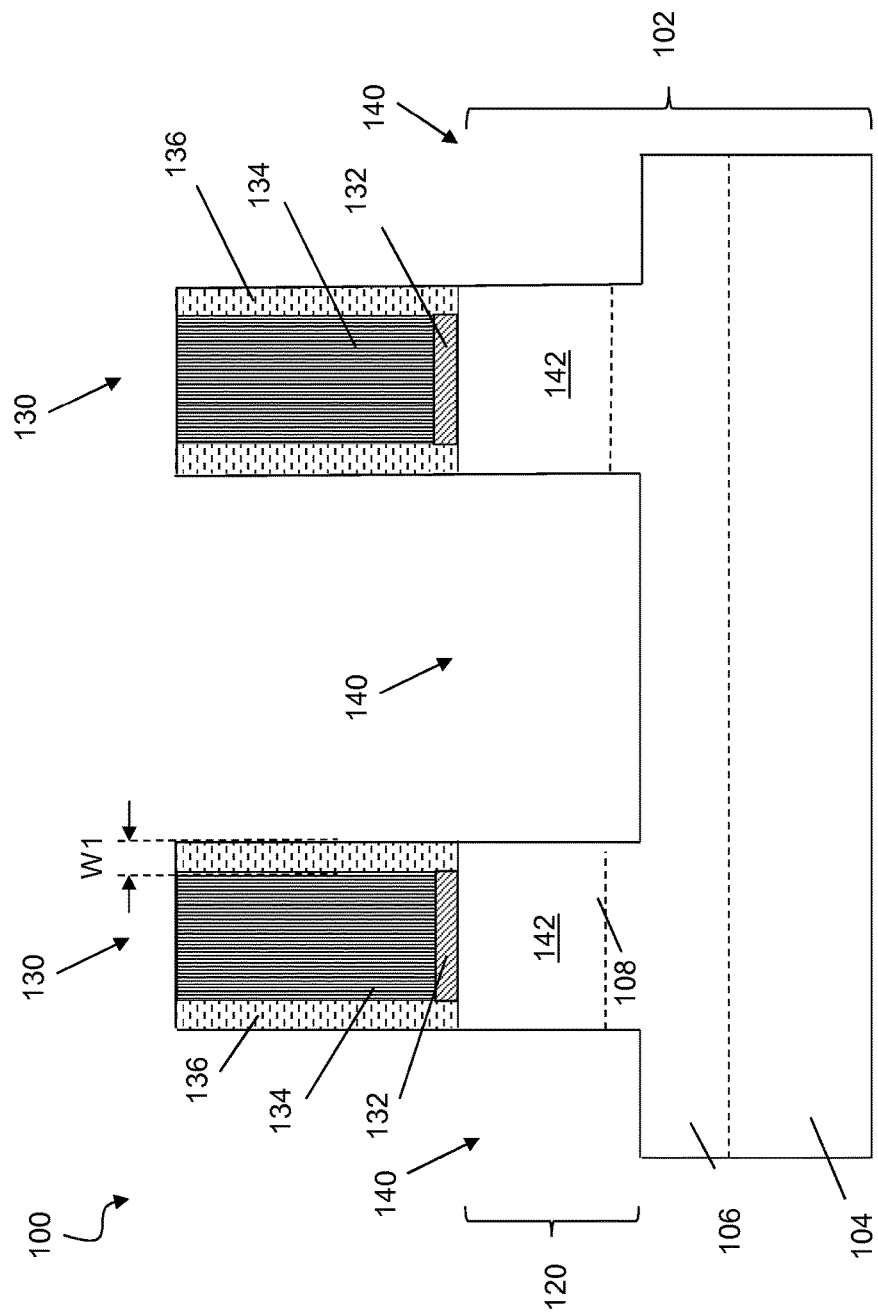
FIGS. 3-7 show cross-sectional views of FIG. 2 undergoing aspects of a method as described herein.

As shown in FIG. 3, the method may also include forming openings 140 on opposing sides of gate stacks 130 in each fin 120, or more particularly, semiconductor layer 108. In some embodiments, openings 140 may be formed partially within isolation layer 106 such that isolation layer 106 provides isolation between adjacent transistors. That is a pair of openings 140 may include a first opening on a first side of gate stack 130 and a second opening on a second side of each gate stack 130. As will be described herein, openings 140 facilitate the formation of sources and drains. Openings 140 may be formed by conventional directional etching processes such as RIE. The remaining portions of each fin 120 beneath gate stacks 130 form a channel region or channel 142 which substantially separates each source and drain as will be described herein. Channel 142 may be formed by the lightly doped semiconductor layer 108. Channel 142 may include, for example, silicon or silicon germanium. In some embodiments, channel 142 may be doped with, for example, boron or phosphorus. Channel 142 may have a respective coefficient of diffusion for the selected source and drain dopant and a respective melting point.

Figure 4:
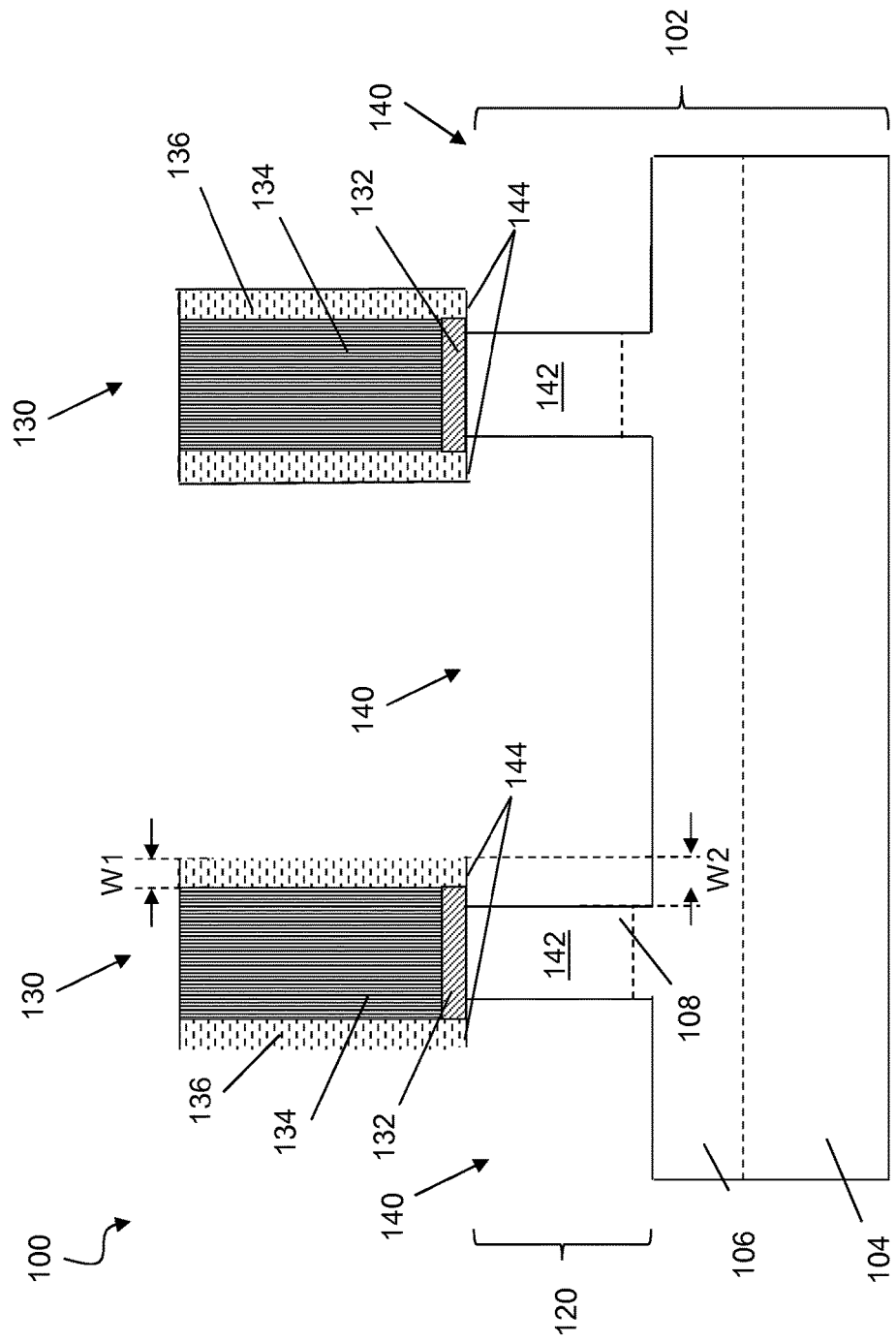

As shown in FIG. 4, an additional etching process may be performed on transistor 100. The additional etching process may include an etching process that etches horizontally, or laterally, such as, for example, an isotropic etch. That is, the sidewalls of each opening 140 may be etched such that gate stack 130 overlaps with each opening 140. Isotropic etch processes are typically used to remove material from a substrate via a chemical process. Unlike reactive ion etch processes, which etch in a single direction, this etch process can etch both horizontally and vertically. Typical examples of such etch processes include pure chemical etching such as wet etch processes and non-plasma dry etch processes. During the isotropic etch process herein, fins 120 may be etched in a horizontal direction such that portions of fins 120 may be removed from under gate stack 130 to create overhangs (or overlaps) 144. Overhangs 144 may have a width W2 of approximately 3 nm to approximately 15 nm. In some embodiments, the directional and isotropic etch components can be combined in a single etch step where the depth of openings 140 is controlled by ion assisted etching while the amount of overhang W2 is controlled by the isotropic chemical dry etch component. Amount of overlap with the gate stack 130 is defined by the difference of W2 and W1. In some embodiment, overhangs 144 may have a width W2 equal to width W1 of spacers 136 resulting in zero overlap. In other embodiments, overhangs 144 may have a width W2 greater than width W1 of spacers 136 such that overhangs 144 extend beneath gate dielectric 132 and gate electrode 134 yielding positive overlap. In one example, overhangs 144 may have a width of W2 of zero to approximately 3 (nanometers) nm.

Figure 5:
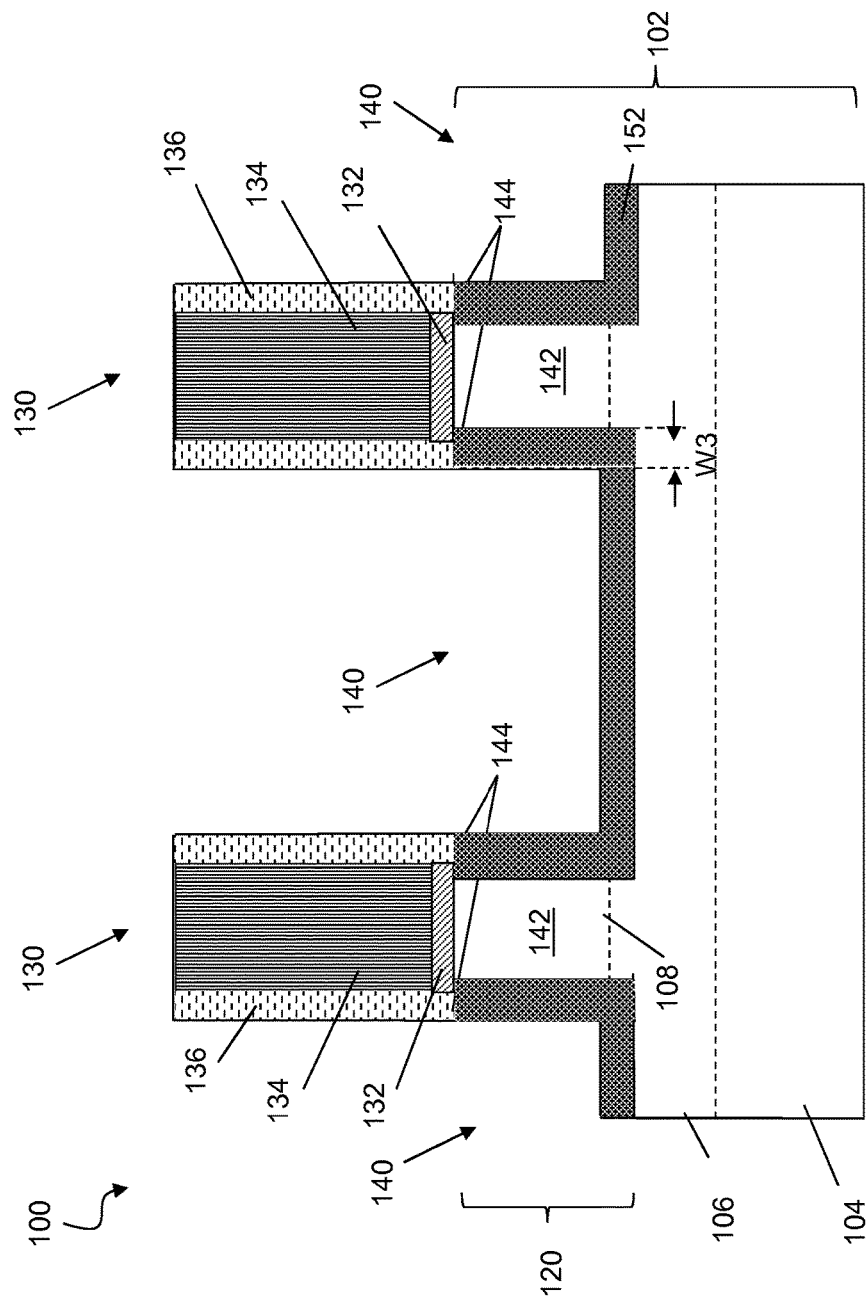

As shown in FIG. 5, after overhangs 144 are created, an extension layer 152 may be formed (e.g., via epitaxial growth) to substantially coat each opening 140. Extension layer 152 acts as an extension of the source and drain regions as will be described herein. During epitaxial growth, substrate 102 and/or isolation layer 106 may be treated with liquid or gaseous precursors and extension layer 152 may be formed over substrate 102 and/or isolation layer 106 such that the crystalline structure of extension layer 152 locks into the crystalline orientation of channel 142 and substrate 102 and/or isolation layer 106 thereunder. Extension layer 152 may include, for example, silicon (Si), germanium (Ge), or silicon germanium (SiGe). Extension layer 152 may be grown such that extension layer 152 substantially coats openings 140 including beneath overhangs 144. That is, extension layer 152 may cover both a vertical surface of channel 142 and a horizontal surface of isolation layer 106. In some embodiments, the thickness of extension layer 152 on vertical surfaces and horizontal surface may not be equal due to different speed of epitaxial growth on different surfaces. Extension layer 152 may have a width W3 of approximately 3 to approximately 20 nm. In some embodiments, width W3 of extension layer 152 may be equal to or less than width W2 (FIG. 4) of overhangs 142 such that extension layer 152 aligns with overhangs 144. In other embodiments, width W3 of extension layer 152 may be greater than width W2 of overhangs such that extension layer 152 extends into openings 140 beyond spacer 136. Extension layer 152 may have a respective coefficient of diffusion for the selected source and drain dopant and a respective melting point.

Figure 6:
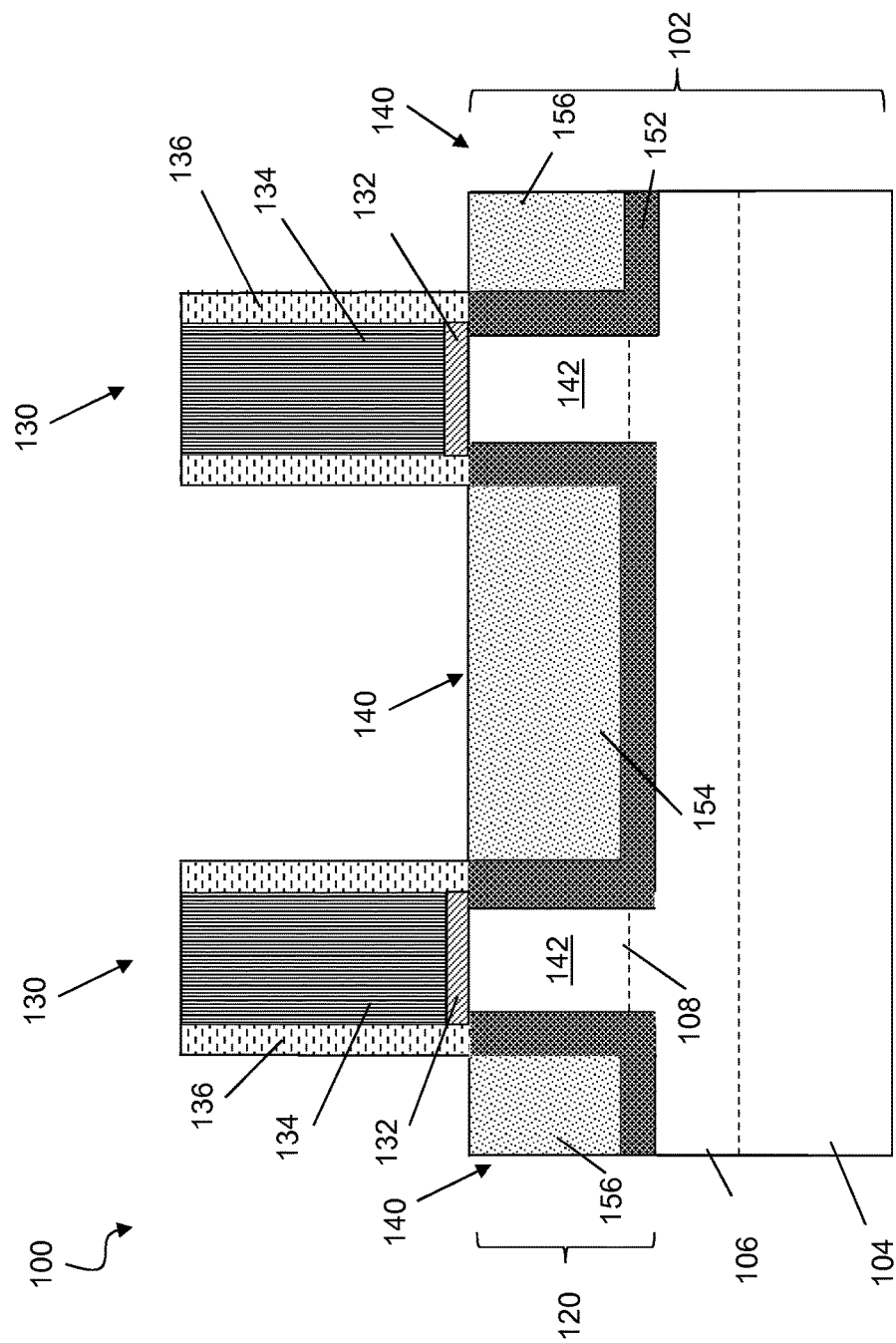

Referring now to FIG. 6, a source 154 and a drain 156 may be formed on opposing sides of each gate stack 130 such that sources 154 and drains 156 alternate between gate stacks 130 on each fin 120. More particularly, sources 154 and drains 156 may be formed on opposing side of channel regions 142 positioned under gate stacks 130. Sources 154 and drains 156 may include for example, silicon (Si), silicon germanium (SiGe), silicon carbide (SiC) or combinations thereof. Sources 154 and drains 156 may be formed, for example, by epitaxial growth. In some embodiments, sources 154 and drains 156 may be doped with p-type or n-type dopants wherein the polarity of the dopants are the same as transistor-type. N-type is element introduced to a semiconductor to generate free electron (by "donating" electron to the semiconductor) and must have one more valance electron than semiconductor. N-type dopants may include but are not limited to: phosphorous (P), arsenic (As), and antimony (Sb) in silicon (Si) or germanium (Ge) and, in gallium arsenide (GaAs) and other III-V materials, sulphur (S), selenium (Se), tellurium (Te), tin (Sn), silicon (Si), and carbon (C). P-type is element introduced to a semiconductor to generate free hole (by "accepting" electron from the semiconductor atom and "releasing" hole at the same time) and the acceptor atom must have one valence electron less than the host semiconductor. P-type dopants may include but are not limited to: boron (B), aluminum (Al), indium (In), and gallium (Ga) in silicon (Si) or germanium (Ge), and, in gallium arsenide (GaAs) and other III-V materials, magnesium (Mg), zinc (Zn), tin (Sn), silicon (Si), and carbon (C). Sources 154 and drains 156 may have a respective coefficient of diffusion for the selected dopant and a respective melting point.

Still referring to FIG. 6, the resulting structure after formation of sources 154 and drains 156 may include a gate stack 130 on a substrate 102, a channel 142 under gate stack 130 within substrate 102, a source 154 and a drain 156 on opposing sides of channel 142, and an extension layer 152 substantially separating source 154 and drain 156 from channel 142. As used herein, channel 142 being "under" gate stack 130 may also describe an embodiment wherein channel 142 is surrounded by gate stack 130 at both a vertical and horizontal orientation of channel 142. As previously discussed, each of the channel 142, source and drain 154, 156, and extension layer 152 may have a respective coefficient of diffusion for a source and drain dopant and a melting point. In one embodiment, extension layer 152 may have a greater coefficient of diffusion than a coefficient of diffusion of channel 142 for a particular source and drain dopant. Additionally, extension layer 152 may have a melting point that is less than a melting point of channel 142. In another embodiment, extension layer 152 may have a greater coefficient of diffusion than both a coefficient of diffusion of channel 142 and a coefficient of diffusion of sources 154 and drains 156 for a particular source and drain dopant. Additionally, extension layer 152 may have a melting point that is less than both the melting point of channel 142 and the melting point of sources 154 and drains 156.

For example, FINFET 100 may include an n-type field effect (nFET) transistor. NFET transistor may include a silicon (Si) channel 142, a silicon germanium (SiGe) extension layer 152, and a silicon carbon (Si:C) alloy source 154 and drain 156. As discussed herein, silicon (Si) channel 142 may be optionally doped with boron (B). Further, silicon carbon (Si:C) alloy source 154 and drain 156 may be doped with phosphorus (P), i.e., the source and drain dopant. Silicon (Si) channel 142 may have a coefficient of diffusion of phosphorus (P) from approximately 5e-14 $cm^2$/s to approximately 8e-14 $cm^2$/s at about 1000° C. of ambient temperature and approximately 5e19 cm−3 active (electron) concentration. Silicon (Si) channel 142 may have a melting point from approximately 1412° C., the melting point of crystalline silicon (Si), with boron concentration in channel 142 of less than 1e18 $cm^{-3}$. Silicon germanium (SiGe) extension layer 152 may have a coefficient of diffusion of phosphorus (P) from approximately 1e-13 $cm^2$/s to approximately 1e-11 $cm^2$/s at about 1000° C. of ambient temperature and approximately 5e19 cm−3 active (electron) concentration. Silicon germanium (SiGe) extension layer 152 may have a melting point from approximately 1130° C. to approximately 1380° C. The melting point of silicon germanium (SiGe) extension layer 152 corresponds to the germanium (Ge) content in silicon germanium (SiGe) from about 75% ($Si_{0.25}Ge_{0.75}$) to about 20% ($Si_{0.8}Ge_{0.2}$). Silicon carbon (Si:C) alloy source 154 and drain 156 may have coefficients of diffusion of phosphorus (P) from approximately 5e-15 $cm^2$/s to approximately 8e-14 $cm^2$/s at about 1000° C. of ambient temperature and approximately 5e19 cm−3 active (electron) concentration. Silicon carbon (Si:C) alloy sources 154 and drains 156 may have melting points from approximately 1412° C. to approximately 1500° C. depending on the carbon (C) content in the silicon carbon (Si:C) alloy from 0% (pure Si) to 4% ($Si_{0.96}C_{0.04}$). As should be clear from the stated values, extension layer 152 may have a greater coefficient of diffusion than channel 142. Additionally, extension layer 152 may have a lower melting point than channel 142. Sources 154 and drains 156 may have lower coefficients of diffusion than extension layer 152. Further, sources 154 and drains 156 may have greater melting points than extension layer 152 and channel 142. As should be understood, the coefficient of diffusion of a particular dopant species, i.e., the source and drain dopant, in channel 142, extension layer 152, source 154, and drain 156 depends on various factors such as for example, temperature, pressure, and the state of the material.

As another example, FINFET 100 may include a p-type field effect (pFET) transistor. PFET transistor may include a silicon germanium (SiGe) channel 142, a germanium (Ge) extension layer 152, and a silicon germanium (SiGe) alloy source 154 and drain 156. As discussed herein, silicon germanium (SiGe) channel 142 may be optionally doped with phosphorus (P). Further, silicon germanium (SiGe) source 154 and drain 156 may be doped with gallium (Ga), i.e., the source and drain dopant. Silicon germanium (SiGe) channel 142 may have a coefficient of diffusion of gallium (Ga) from approximately 1e-13 $cm^2$/s to approximately 5e-13 $cm^2$/s at about 900° C. of ambient temperature and approximately 5e19 cm-3 active (hole) concentration. Silicon germanium (SiGe) channel 142 may have a melting point from approximately 980° C. to approximately 1130° C. with a germanium (Ge) content from approximately 95% to approximately 75% and with phosphorus concentration in channel 142 of less than 1e18 $cm^{-3}$. Germanium (Ge)

extension layer 152 may have a coefficient of diffusion of gallium (Ga) from approximately 1e-12 cm$^2$/s to approximately 1e-11 cm$^2$/s at about 900° C. of ambient temperature and approximately 5e19 cm-3 active (hole) concentration. Germanium (Ge) extension layer 152 may have a melting point of approximately 940° C., the melting point of crystalline germanium (Ge). Silicon germanium (SiGe) source 154 and drain 156 coefficients of diffusion of gallium from approximately 1e-14 cm$^2$/s to approximately 5e-13 cm$^2$/s at about 900° C. of ambient temperature and approximately 5e19 cm-3 active (hole) concentration. Sources 154 and drains 156 may have melting points from approximately 1130° C. to approximately 1412° C. depending on the germanium (Ge) content in SiGe alloy from 0% (pure Si) to 75% (Si$_{0.25}$Ge$_{0.75}$). As should be clear from the stated values, extension layer 152 may have a greater coefficient of diffusion than channel 142. Additionally, extension layer 152 may have a lower melting point than channel 142. Sources 154 and drains 156 may have lower coefficients of diffusion than extension layer 152. Further, sources 154 and drains 156 may have greater melting points than extension layer 152 and channel 142. As should be understood, the coefficient of diffusion of a particular dopant species in extension layer 152 and/or channel 142 depends on various factors such as for example, temperature, pressure, electrically active concentration of dopants, and the state of the material.

Figure 7:
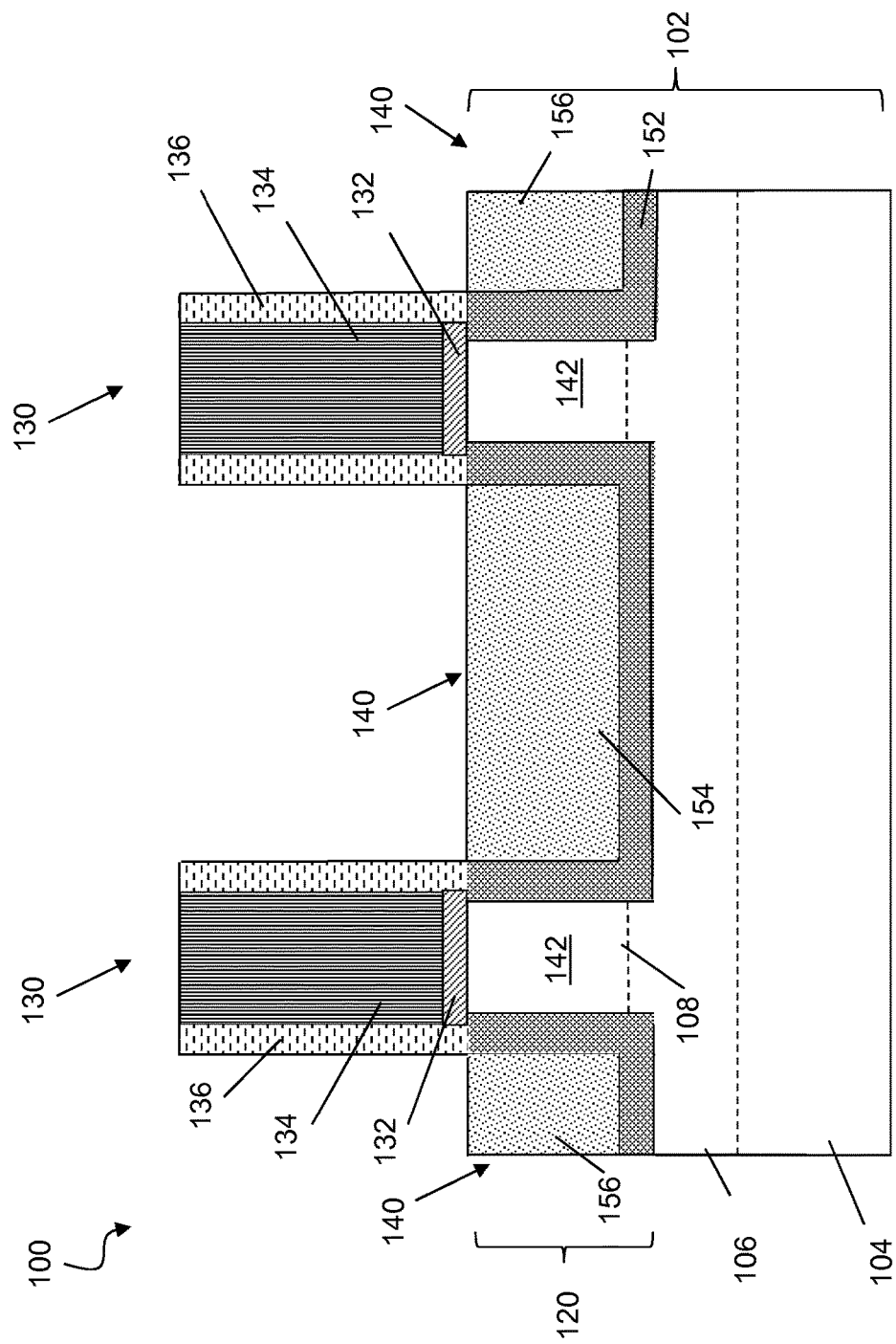

As shown in FIG. 7, FINFET 100 may undergo a thermal treatment process such that the composition of extension layer 152 changes due to the diffusion of source/drain 154, 156 dopants into extension layer 152. In this way, extension layer 152 acts as an extension of source 154 and drain 156 beneath gate stack 130. As previously discussed, extension layer 152 may have a greater coefficient of diffusion and a lower melting point than channel 142 and source 154 and drain 156. The thermal treatment processes described herein are customized based on the coefficient of diffusion and melting point of extension layer 152. Contrary to ordinary thermal treatment optimization strategy of reducing overall thermal budget (i.e. reducing anneal temperature and/or duration) to suppress dopant diffusion in extensions, the thermal treatment is selected to induce a substantial diffusion within the extension layer. This may be achieved by bringing annealing temperature close to or above the melting point of extension layer 152. Advantageously, the annealing duration is kept short. Short duration is needed to prevent any phase segregation in extension layer 152 when it brought close to its melting point. Alloyed semiconductors such as silicon germanium (SiGe) may have two separate melting points referred to as "solidus" and "liquidus". Annealing above "solidus" but below "liquidus" leads to the segregation of solid and liquid phases within the extension layer that may result in a non-uniform composition after annealing. Annealing above "liquidus" leads to a full liquification of entire extension layer producing melt liquid with uniform composition. As the concentration of silicon (Si) in extension layer 152 decreases, both "solidus" and "liquidus" melting points decrease, and, the lower the temperature of the thermal treatment may be. In one embodiment, a millisecond anneal tool such as a millisecond flash or laser anneal tool may be used at approximately 900° C. to approximately 1300° C. for approximately 0.1 milliseconds to approximately 10 milliseconds. More specifically, the millisecond annealing temperature is selected to be above the extension layer "solidus" temperature while the short annealing duration prevents the phase segregation. In another embodiment, a conventional rapid thermal processing tool may also be used at temperatures from about 300° C. below the "solidus" melting point to the "solidus" melting point of extension layer 152 for a duration of from approximately 0.5 seconds to approximately 5 seconds. In another embodiment, a nanosecond laser anneal tool may be used at a temperature of approximately 940° C. to approximately 1400° C. for a duration of approximately 10 nanoseconds to approximately 1 microsecond. The temperature of nanosecond annealing is selected to be above the extension layer "liquidus." Advantageously, the diffusion coefficient of the fully liquified extension layer increases approximately $10^6$-$10^9$ times (million to billion fold) resulting in a substantial diffusion within. The melting point of channel 142 will not be crossed, and therefore, channel 142 will not liquefy or melt. In this way, extension layer 152 acts as a trap accumulating dopants and preventing diffusion of dopants into channel 142 without using retardants as conventionally used. That is, the use of extension layer 152 enables diffusion of dopants laterally beneath of overhangs 144 of gate stacks 130 without diffusion of the dopants into channels 142. This provides the benefits of having the dopants disposed beneath gate stack 130 without the disadvantages of the dopants diffusing into channels 142.

Temperature and duration of beneficial thermal treatments may also be specified through a quantity known as the characteristic dopant diffusion length, a length to which the dopants spread within the target material during thermal treatment. The characteristic diffusion length is connected to the diffusion coefficient and anneal duration via the following formula $2*sqrt(D*t)$, where sqrt stands for the square root, D is the diffusion coefficient of the dopant and the target material, and t is the anneal duration. Accordingly, the temperature and duration are selected such that the characteristic diffusion length of the source and drain dopant within extension layer 152 is larger than approximately one third of width W3 (FIG. 5). For example, in the case of a millisecond range anneal with the duration of about 1 millisecond, the anneal temperature is raised such that the diffusion coefficient for dopant in extension layer 152 is about 1e-10 cm$^2$/sec yielding the characteristic diffusion length of about 6 nm. Similarly, in the case of a rapid thermal anneal with the duration of about 1 second, the anneal temperature is raised such that the diffusion coefficient for dopant in extension layer 152 is about 1e-13 cm$^2$/sec yielding the characteristic diffusion length of about 6 nm. In the case of a nanosecond-scale anneal with the duration of 100 nanosecond, the anneal temperature must be raised above the "liquidus" melting point of extension layer 152 to force the diffusion coefficient to be above 1e-6 cm$^2$/sec yielding the characteristic diffusion length of above about 6 nm.

In example regarding the nFET transistor, wherein extension layer 152 includes silicon germanium (SiGe) and sources 154 and drains 156 each include phosphorus doped silicon-carbon alloy (Si:C:P), phosphorus (P) will diffuse into, spread around, and accumulate in extension layer 152 such that the new composition of extension layer 152 includes phosphorus doped silicon germanium (SiGe:P). In example regarding the pFET transistor, wherein extension layer 152 includes germanium (Ge) and sources 154 and drains 156 each include gallium (Ga) and boron (B) doped silicon germanium (SiGe:Ga:B), gallium (Ga) will diffuse into, spread around, and accumulate in extension layer 152 such that the new composition of extension layer 152 includes gallium doped germanium (Ge:Ga). Selection of a particular combination of source and drain dopants depend on their respective solid solubilities in extension layer 152, source 154, and drain 156. The dopants may be selected to have solid solubility above about 5e19 cm$^{-3}$ to be able to accumulate in the extension layer 152 and to support a low resistivity of source and drain material. Phosphorus (P), for instance, has its solid solubility in excess of 1e20 cm$^{-3}$ in pure silicon (Si), silicon-carbon alloys (Si:C), silicon germanium (SiGe), and pure germanium (Ge). Accordingly, phosphorus (P) may be used as a single nFET source and drain dopant with the extension layer 152. Boron (B) has its solid solubility in the excess of 1e20 cm$^{-1}$ in silicon (Si) and silicon germanium (SiGe) with a germanium (Ge) content of below 75% but has a lower solid solubility in silicon germanium (SiGe) with germanium (Ge) content above 75% with its solid solubility in pure germanium (Ge) dropping below about 5e19 cm$^{-3}$. Gallium (Ga), on the other hand, has its solid solubility in the excess of 1e20 cm$^{-3}$ in pure germanium (Ge) and in silicon germanium (SiGe) with germanium (Ge) content of above 80% but has a lower solid solubility in silicon germanium (SiGe) with germanium (Ge) content below 75% with its solid solubility dropping below about 5e19 cm$^{-3}$ in pure silicon (Si). Accordingly, both gallium (Ga) and boron (B) may be used as pFET source and drain dopants with extension layer 152 such that gallium (Ga) diffuses and accumulates in extension layer 152 while a high concentration of boron (B), in the excess of 1e20 cm$^{-3}$, remains in source 154 and drain 156.

Figure 8:
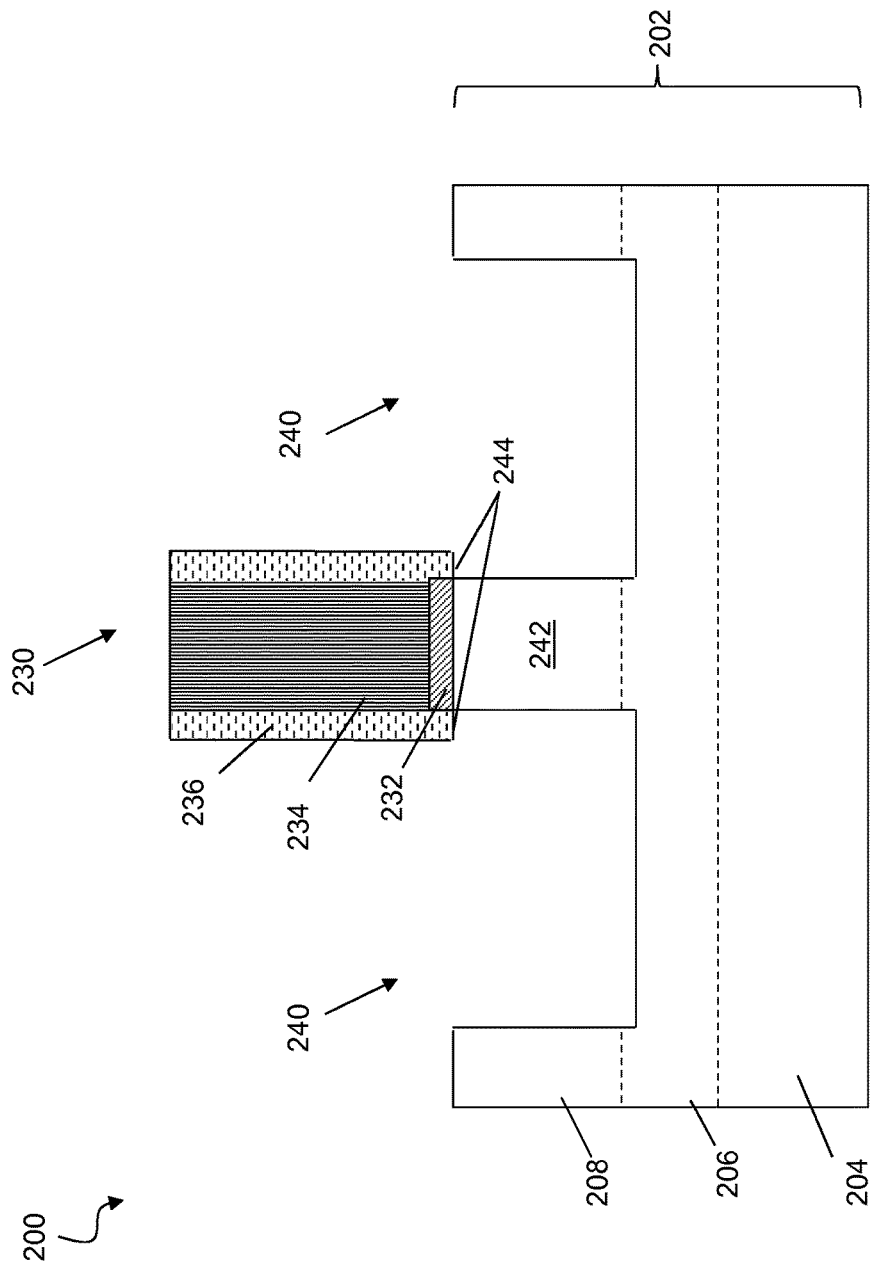
FIGS. 8-9 show a cross-sectional view of another embodiment of the invention.
Figure 9:
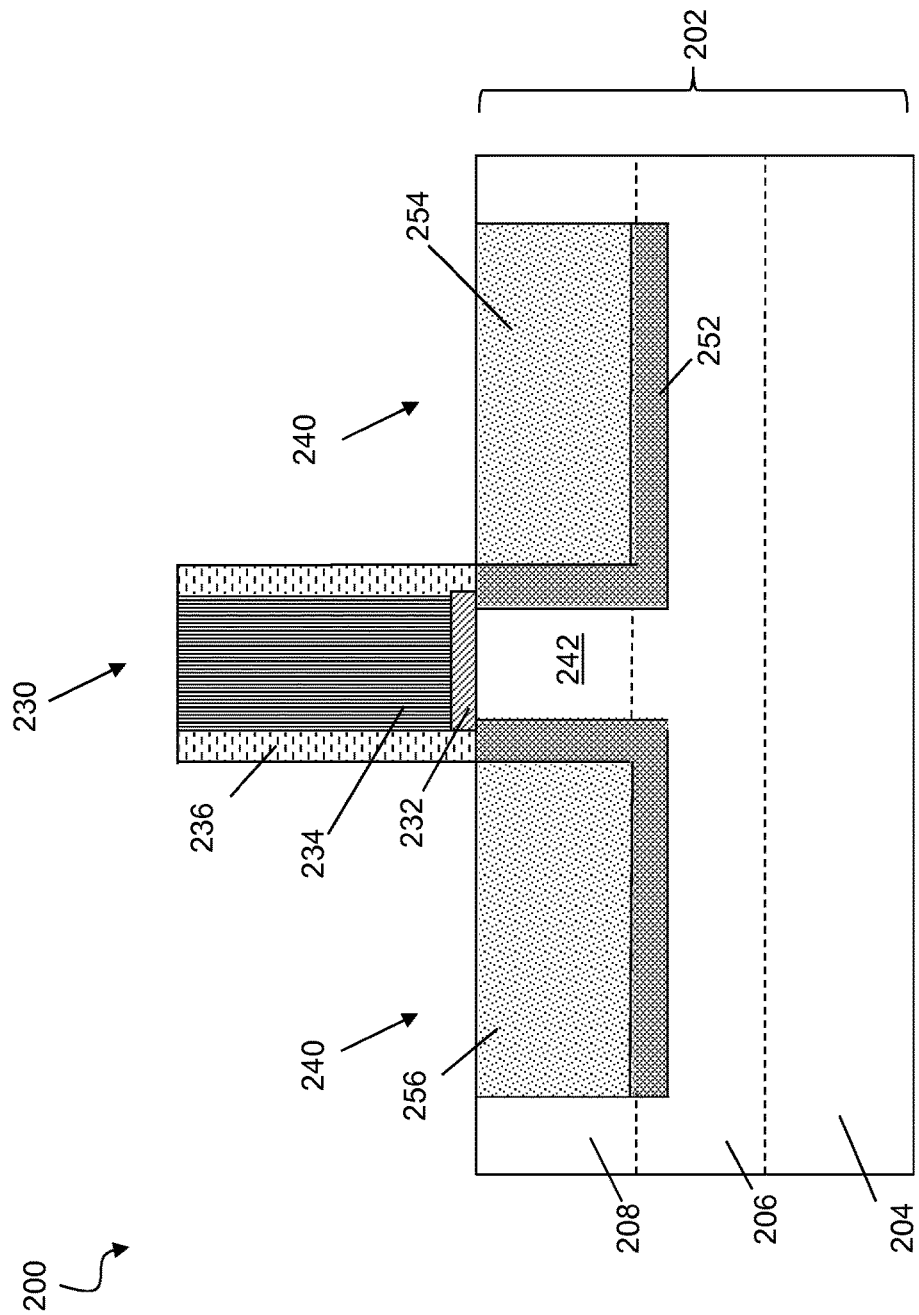

Referring now to FIGS. 8-9 which show another embodiment of the invention wherein the IC structure includes a planar transistor such as a metal-oxide field-effect transistor (MOSFET) 200. In this embodiment, MOSFET 200 may be formed by forming a substrate 202. Substrate 202 may include semiconductor layer 204, an isolation layer 206, and another semiconductor layer 208 as previously described. Semiconductor layers 204, 208 and isolation layer 206 may include any materials previously discussed for semiconductor layers 104, 108 and isolation layer 106, respectively. Further, a hardmask (not shown) may be formed over substrate 202 and etched to expose portions of substrate 202. The exposed portion of the substrate 202 may be lightly doped as previously described to facilitate formation of channels. A gate stack 230 may formed on the exposed substrate 202, or more specifically on semiconductor layer 208, and the hardmask may be removed. Gate stack 230 may include a gate dielectric 232, a gate electrode 234 overlying gate dielectric 232, and spacers 236 as previously discussed with respect to FIGS. 1-2. As also discussed, openings 240 may be formed in substrate 202, or more particularly, semiconductor layer 208 (and partially within isolation layer 206). Openings 240 may be formed as similarly described with respect to FIG. 3. Additionally, overhangs 244 may be formed via an isotropic etch as described with respect to FIG. 4. The remaining portion of semiconductor layer 208 beneath gate stack 230 may include a channel 242. Overhangs 244 may be formed by removing portions of substrate 202 (or more specifically, semiconductor layer 208) from under gate stack 130 creating an overlap as described with respect to FIG. 4.

As shown in FIG. 9, extension layer 252 may be formed (e.g., grown) as described with reference to FIG. 5. Additionally, source 254 and drain 256 may be formed (e.g., grown) and doped with either n-type or p-type dopants as discussed herein. Further, MOSFET 200 may undergo any of the thermal treatment processes as described with respect to FIG. 7. Extension layer 252 including the source and drain dopant have a greater coefficient of diffusion and a lower melting point than channel 242 including the source and drain dopant. Therefore, the source and drain dopant will not diffuse into channel 242. Rather, the source and drain dopant will diffuse into, spread around, and accumulate in extension layer 252. Source 254 and drain 256 including the source and drain dopant may have a coefficient of diffusion lower than that of the extension layer 252 and melting point higher than the extension layer 252. As previously discussed, the properties (i.e., melting point and coefficient of diffusion) of extension layer 252 result in extension layer 252 serving as a trap accumulating dopants from the source drain and preventing diffusion of dopants into channel 242 without using retardants as conventionally used.

As shown in FIG. 9, the resulting structure of MOSFET 200 may include a gate stack 230 on a substrate 202 and a channel 242 having a first coefficient of diffusion for the source and drain dopant under the gate stack 230 within the substrate 202. Further, MOSFET 200 may include a source 254 and a drain 256 on opposing sides of channel 242, wherein source 254 and the drain 256 each having a second coefficient of diffusion for their dopants. MOSFET 200 may also include an extension layer 252 substantially separating each of source 254 and drain 256 from channel 242 wherein extension layer 252 has a third coefficient of diffusion for the source and drain dopant. The third coefficient of diffusion may be greater than the first and the second coefficient of diffusion.

While resultant sources 154, 254 and drains 156, 256 in FIGS. 7 and 9 are shown as identical structures, their respective structures including presence of the extension layer 152, 252 and extension layer 152, 252 attributes such as widths W1, W2, W3, extension layer 152, 252 material, and combination of dopants do not need to be identical on each side of channel 142, 242.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method for forming a transistor, the method comprising:

forming a gate stack on a substrate, the gate stack formed over a channel, the gate stack including a gate dielectric and a gate electrode over the gate dielectric;

forming a spacer directly contacting a sidewall of the gate dielectric and a sidewall of the gate electrode;

forming a pair of openings in the substrate, the pair of openings having a first opening on a first side of the gate stack and a second opening on a second side of the gate stack;

forming an extension layer to substantially coat each of the pair of openings, the extension layer including a first sidewall facing the channel, a second sidewall opposite to the first sidewall, and a top surface extending between and contiguous with the first sidewall and the second sidewall;

forming a doped source region in the first opening and a doped drain region in the second opening, thereby forming the transistor, each of the doped source region and the doped drain region including a dopant; and performing a thermal treatment process to cause diffusion of the dopant into the extension layer, wherein the dopant and the channel together have a first coefficient of diffusion, and the dopant and the extension layer together have a second coefficient of diffusion, wherein the second coefficient of diffusion is greater than the first coefficient of diffusion, wherein the forming the doped source region and the doped drain region include forming the doped source region and the doped drain region such that the doped source region and the doped drain region each have a third coefficient of diffusion, the third coefficient of diffusion being less than the second coefficient of diffusion, wherein a source material of the doped source region and a drain material of the doped drain region each include a melting point that is greater than a melting point of the channel, wherein the top surface of the extension layer directly contacts a bottom surface of the spacer and a bottom surface of the gate dielectric, the extension layer being overlapped by the gate dielectric, and wherein the second sidewall of the extension layer is substantially vertically aligned with a sidewall of the spacer facing away from the gate stack.

2. The method of claim 1, wherein the melting point of the channel is greater than a melting point of the extension layer.

3. The method of claim 2, wherein the melting point of the source material of the doped source region and the drain material of the doped drain region is greater than the melting point of the extension layer.

4. The method of claim 1, wherein the forming the transistor includes forming a n-type field effect transistor (NFET) and the forming the extension layer includes growing a layer of silicon germanium.

5. The method of claim 4, wherein the forming the doped source region and the doped drain region include:
growing a silicon source region and a silicon drain region; and
doping the silicon source region and the silicon drain region with the dopant, the dopant including at least one of: phosphorus, arsenic, or antimony.

6. The method of claim 1, wherein the forming the transistor includes forming a p-type field effect transistor (PFET) and the forming the extension layer includes growing a layer of germanium.

7. The method of claim 6, wherein the forming the doped source region and the doped drain region include:
growing a silicon germanium source region and a silicon germanium drain region; and
doping the silicon germanium source region and the silicon germanium drain region with the dopant, the dopant including at least one of: boron, gallium, or indium.

8. The method of claim 1, further comprising: performing a laser anneal at a temperature of approximately 940° C. to approximately 1400° C. for approximately 10 nanoseconds to approximately 1 microsecond.

9. The method of claim 1, further comprising: performing a laser anneal at a temperature of approximately 900° C. to approximately 1300° C. for approximately 0.1 milliseconds to approximately 10 milliseconds.

10. The method of claim 1, further comprising, prior to the forming the extension layer, performing an etch on sidewalls of each of the pair of openings such that the gate stack overlaps with each of the pair of openings.

11. A method for forming a fin-shaped field effect transistor (FINFET), the method comprising:

forming a gate stack on a substrate, the gate stack formed over a channel, the gate stack including a gate dielectric and a gate electrode over the gate dielectric;

forming a spacer directly contacting a sidewall of the gate dielectric and a sidewall of the gate electrode;

forming a pair of openings in the substrate, the pair of openings having a first opening on a first side of the gate stack and a second opening on a second side of the gate stack;

etching sidewalls of each of the pair of openings such that the gate stack overlaps with each of the pair of openings;

forming an extension layer to substantially coat each of the pair of openings such that the extension layer is at least partially disposed directly beneath the gate stack, the extension layer including a first sidewall facing the channel, a second sidewall opposite to the first sidewall, and a top surface extending between and contiguous with the first sidewall and the second sidewall;

forming a doped source region in the first opening and a doped drain region in the second opening, thereby forming the FINFET, each of the doped source region and the doped drain region including a dopant; and performing a laser anneal at a temperature that melts the extension layer without melting the channel and causes diffusion of the dopant from the doped source region and the doped drain region into the extension layer that is at least partially disposed directly beneath the gate stack, wherein the dopant and the channel together have a first coefficient of diffusion and the dopant and the extension layer together have a second coefficient of diffusion, wherein the second coefficient of diffusion is greater than the first coefficient of diffusion, wherein the forming the doped source region and the doped drain region include forming the doped source region and the doped drain region such that each have a third coefficient of diffusion, the third coefficient of diffusion being less than the second coefficient of diffusion, wherein the top surface of the extension layer directly contacts a bottom surface of the spacer and a bottom surface of the gate dielectric, the extension layer being overlapped by the gate dielectric, and wherein the second sidewall of the extension layer is substantially vertically aligned with a sidewall of the spacer facing away from the gate stack.

* * * * *